United States Patent [19]

Ando et al.

[11] Patent Number: 4,926,232
[45] Date of Patent: May 15, 1990

[54] RESONANT-TUNNELING BIPOLAR TRANSISTOR

[75] Inventors: Yuji Ando; Hideo Toyoshima, both of Tokyo, Japan

[73] Assignee: NEC Corporation, Japan

[21] Appl. No.: 238,625

[22] Filed: Aug. 30, 1988

[30] Foreign Application Priority Data

Sep. 2, 1987 [JP] Japan ............................... 62-220644
Oct. 1, 1987 [JP] Japan ............................... 62-249452

[51] Int. Cl.$^5$ ............................................. H01L 29/72
[52] U.S. Cl. ......................................... 357/34; 357/4; 357/12; 357/16; 357/61
[58] Field of Search ................... 357/4, 12, 16, 34, 61

[56] References Cited

U.S. PATENT DOCUMENTS 4,853,753 8/1989 Capasso et al. ...................... 357/16

Primary Examiner—Edward J. Wojciechowicz
Attorney, Agent, or Firm—Laff, Whitesel, Conte & Saret

[57] ABSTRACT

There is disclosed a resonant-tunneling bipolar transistor with a quantum-well comprising an inversion forming layer of an n-type gallium arsenide which is in contact with a first potential barrier layer of an undoped aluminum gallium arsenide partially defining the quantum-well, so that a two-dimensional hole gas layer serving as a base region takes place at the interface between the inversion forming layer and the first potential barrier layer due to differences in electron affinity and in the sum of electron affinity and energy bandgap upon application of an appropriate biasing voltage, thereby producing hot electrons injected from an emitter region through the quantum-well into the base region by the agency of a resonant-tunneling phenomenon.

15 Claims, 9 Drawing Sheets

PRIOR-ART

N-TYPE EMITTER REGION
N-TYPE COLLECTOR REGION
COLLECTOR BARRIER REGION
N-TYPE BASE REGION
QUANTUM WELL STRUCTURE

PRIOR-ART

N-TYPE COLLECTOR RIGION
P-TYPE BASE REGION
QUANTUM WELL STRUCTURE
N-TYPE EMITTER REGION

RESONANT-TUNNELING BIPOLAR TRANSISTOR

FIELD OF THE INVENTION

This invention relates to a resonant-tunneling bipolar transistor and, more particularly, to a resonant-tunneling bipolar transistor having a quantum well structure for injecting carriers into an inversion layer serving as a base region.

BACKGROUND OF THE INVENTION

A typical example of the resonant-tunneling hot electron transistor is disclosed by Yokoyama et al. in "A New Functional, Resonant-Tunneling Hot Electron Transistor (RHET)", Japanese Journal of Applied Physics, Vol. 24, No. 11, November, 1985, pages L853 to L854. The resonant-tunneling hot electron transistor disclosed by Yokoyama has an unique energy band diagram shown in FIG. 1 in which a quantum well 1 is formed in the quantum well structure intervening between the n-type emitter region and the n-type base region. Between the n-type base region and the n-type collector region is formed the collector barrier region which provides a potential barrier 2 with respect to the carriers traveling over the n-type base region. E1 indicates the energy of resonant state formed in the quantum well.

In the thermal equilibrium state, no carrier injection takes place from the quantum well to the base region. However, when an appropriate biasing voltage is applied between the n-type emitter region and the n-type base region, a resonant tunneling phenomenon takes place, so that electrons 3 are injected into the n-type base region. Each of the electrons injected into the n-type base region travels in a ballistic or near-ballistic manner toward the n-type collector region. However, the electrons experience various types of scattering such as an inter-valley scattering during the travel in the n-type base region, so that electrons are scattered and accordingly lose the respective kinetic energies This results in that most of the electrons can not excess the potential barrier 2 formed between the n-type base region and the n-type collector barrier region. For reduction of the undesirable scattering, it is necessary to form a thin base region smaller in thickness than the mean free path of the electron. However, the base region is hardly reduced to a thickness less than the mean free path of the electron because the base resistance is increased due to reduction in sheet carrier density. Moreover, another problem is encountered in the prior-art resonant-tunneling hot electron transistor in formation of base-collector junction. There are trade-offs between the amount of electrons excessing the potential barrier 2 and the base resistance or the easy formation. Then, the resonant-tunneling hot electron transistor merely realizes a current gain ranging between value 1 and value 5. Moreover, the collector barrier region is insufficient to block the thermo-electrons at room temperatures, and, for this reason, a large amount of leakage current takes place between the base region and the collector region. In other words, the resonant-tunneling hot electron transistor hardly operates in the room temperatures.

Another example is disclosed by Capasso et al. in "QUANTUM-WELL RESONANT TUNNELING BIPOLAR TRANSISTOR OPERATION AT ROOM TEMPERATURE", IEEE Electron Device Letters, Vol. EDL-7, No. 10, October 1986, pages 573 to 576.

The resonant-tunneling bipolar transistor disclosed by Capasso et al. is also provided with a quantum well structure for carrier injection, and a negative differential resistance takes place in the base-emitter I-V characteristics as similar to the resonant-tunneling hot electron transistor disclosed by Yokoyama. However, no collector barrier region is formed between the base region and the collector region. Instead of the collector barrier region, a reverse bias p-n junction is used to block the thermo-electrons as shown in FIG. 2. Although the injected electrons are scattered during the travel over the p-type base region and, accordingly, lose the respective kinetic energy, a substantial amount of electrons reach the collector region because no potential barrier is formed between the p-type base region and the n-type collector region. These electrons are conducive to improvement in current gain or current driving capability. However, a problem is encountered in the resonant-tunneling bipolar transistor disclosed by Capasso in the amount of kinetic energy applied to each electron injected into the base region. This is because of the fact that not only base-collector junction but also emitter-base junction are of the p-n type. Each electron injected beyond the emitter-base junction of the p-n type accepts a relatively small amount of kinetic energy which results in that each electron consumes a relatively long time period until reaching the collector region. In detail, the switching speed of the transistor is dominated by the accumulation time period Te of emitter capacitance, the base transit time period Tb and the accumulation and transit time period of collector Tc. The accumulation time period Te and the accumulation and transit time period Tc of the resonant-tunneling bipolar transistor are on respective levels with the resonant-tunneling hot electron transistor. However, the base transit time period Tb is less than that of the resonant-tunneling hot electron transistor, so that the resonant-tunneling bipolar transistor is not on a level with the resonant-tunneling hot electron transistor disclosed by Yokoyama in view of switching speed.

Another prior-art bipolar transistor is disclosed by Matsumoto et al. in "GaAs Inversion-Base Bipolar Transistor (GaAs IBT)", IEEE ELECTRON DEVICE LETTERS, Vol. EDL-7, No. 11, November 1986, pages 627 and 628. The GaAs inversion-base bipolar transistor has a base formed by a two-dimensional hole gas.

SUMMARY OF THE INVENTION

It is therefore an important object of the present invention to provide a resonant-tunneling bipolar transistor which can operate at an improved switching speed and has a large current driving capability.

To accomplish these objects, the present invention proposes to produce an inversion layer of two-dimensional electron gas or two-dimensional hole gas which serves as a base region.

In accordance with the present invention, there is provided a resonant tunneling bipolar transistor comprising: (a) a collector region formed of a first compound semiconductor material of a first conductivity type; (b) an inversion forming region provided on one surface portion of the collector region and formed of a second compound semiconductor material of the first conductivity type; (c) a first potential barrier region provided on the inversion forming region and formed of a third compound semiconductor material which is larger in the sum of electron affinity and energy bandgap or smaller in electron affinity than the second compound semiconductor material; (d) a quantum-well region provided on the first potential barrier region and formed of a fourth compound semiconductor material which is larger in electron affinity or smaller in the sum of electron affinity and energy bandgap than the third compound semiconductor material, the quantum-well region providing a quantum-well where an energy level of resonant state takes place; (e) a second potential barrier region provided on the quantum-well region and formed of a fifth compound semiconductor material which is smaller in electron affinity or larger in the sum of electron affinity and energy bandgap than the fourth compound semiconductor material; (f) an emitter region provided on the second potential barrier region and formed of a sixth compound semiconductor material of the first conductivity type which is larger in electron affinity or smaller in the sum of electron affinity and energy bandgap than the fifth compound semiconductor material, wherein a resonant-tunneling phenomenon takes place at a biasing state applied between the emitter region and the inversion forming region for injecting carriers through the energy level of resonant state into an inversion layer of a second conductivity type opposite to the first conductivity type, the inversion layer being produced at an interface between the first potential barrier region and the inversion forming region under the biasing state.

BRIEF DESCRIPTION OF THE DRAWINGS

The features and advantages of a resonant-tunneling bipolar transistor according to the present invention will be more clearly understood from the following description taken in conjunction with the accompanying drawings in which.

DESCRIPTION OF THE PREFERRED EMBODIMENTS

First Embodiment

Figure 1:
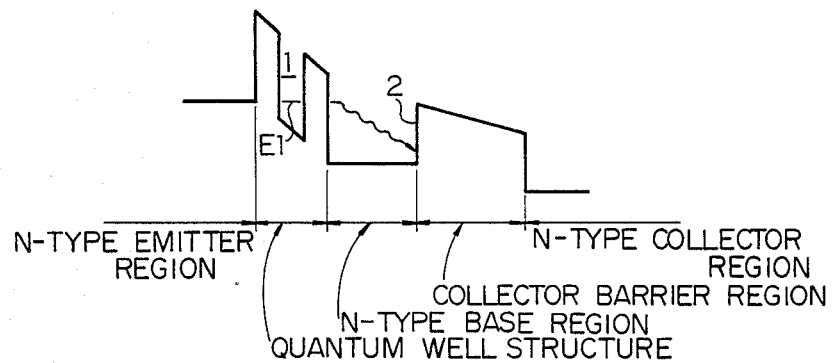
FIG. 1 is a diagram showing the energy band structure in a biasing state created in the resonant-tunneling hot-electron transistor disclosed by Yokoyama.
Figure 2:
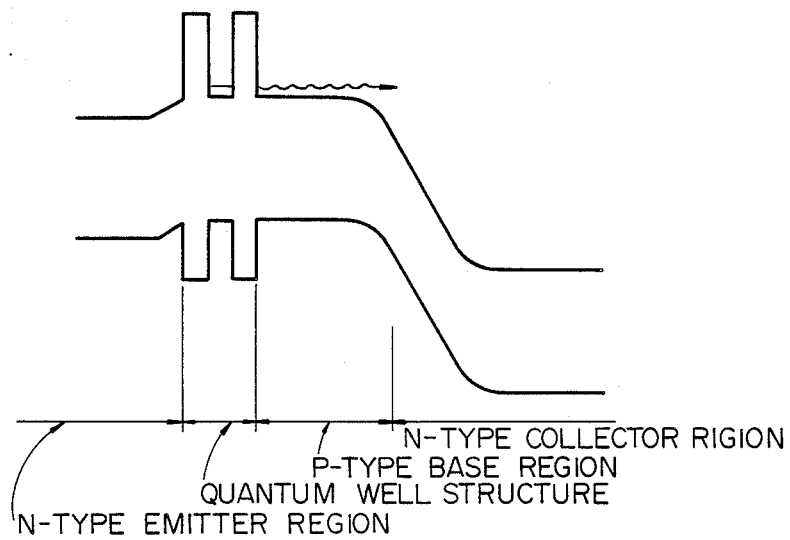
FIG. 2 is a diagram showing the energy band structure in a biasing state created in the resonant-tunneling bipolar transistor disclosed by Capasso.
Figure 3:
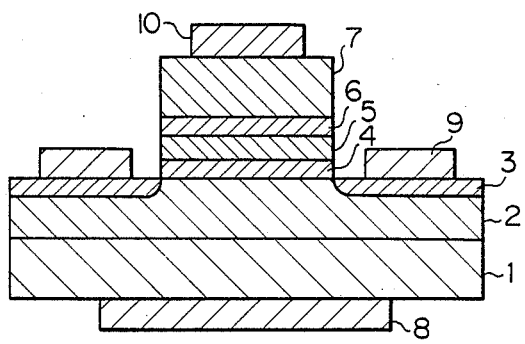
FIG. 3 is a cross sectional view showing the structure of a resonant-tunneling bipolar transistor embodying the present invention.

Referring to FIG. 3 of the drawings, there is shown the structure of a resonant-tunneling bipolar transistor embodying the present invention. The resonant-tunneling bipolar transistor illustrated in FIG. 3 is fabricated on a substrate 1 of an n+ type gallium arsenide and comprises an inversion forming layer 2 of an n-type gallium arsenide formed on the substrate 1, a p+ type gallium arsenide region 3 formed in a peripheral portion of the inversion forming layer 2, a first potential barrier layer 4 of an aluminum gallium arsenide represented by the molecular formula of $Al_xGa_{1-x}As$ and formed on a central portion of the inversion forming layer 2, a quantum-well layer 5 of an undoped gallium arsenide formed on the first potential barrier layer 4, a second potential barrier layer 6 of the undoped aluminum gallium arsenide $Al_xGa_{1-x}As$ formed on the quantum-well layer 5, an emitter layer 7 of an n-type aluminum gallium arsenide represented by the molecular formula of $Al_yGa_{1-y}As$ and formed on the second potential barrier layer 6. The first and second potential barrier layers 4 and 6 are formed of the aluminum-rich aluminum gallium arsenide with respect to the emitter layer 7, so that the suffix y is equal to or greater than 0 but smaller in value than the suffix x which is equal to or less than 1. The resonant-tunneling bipolar transistor further comprises a collector electrode 8 formed on the opposite surface of the substrate 1, a base electrode 9 formed on the p+ type gallium arsenide region 3 and an emitter electrode 10 formed on the emitter layer 7. In this instance, the substrate 1 serves as a part of a collector region, and the p+ type gallium arsenide region serves as a conducting portion.

Figure 4A:
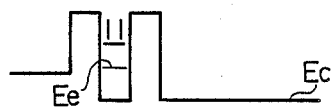
FIG. 4A is a diagram showing the energy band structure in the thermal equilibrium created in the resonant-tunneling bipolar transistor shown in FIG. 3.
Figure 4A:
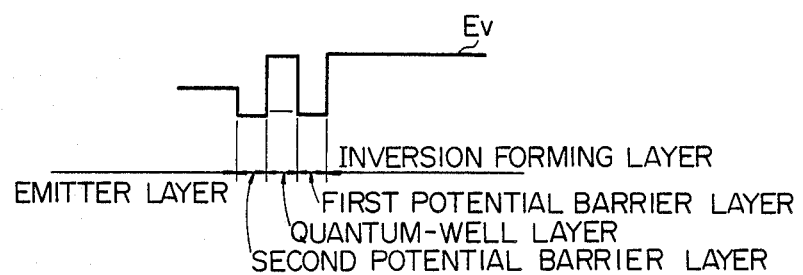
Figure 4B:
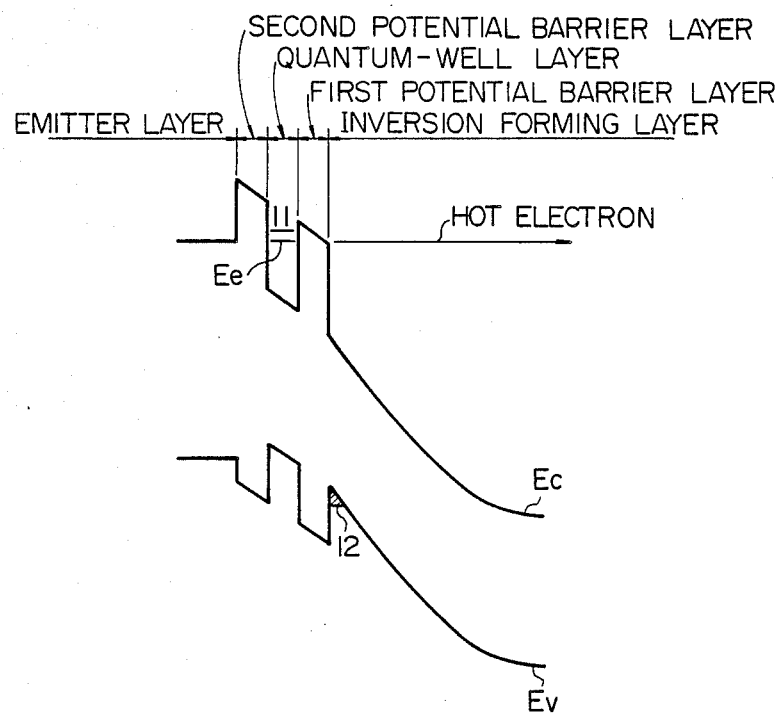
FIG. 4B is a diagram showing the energy band structure in a biasing state created in the resonant-tunneling bipolar transistor shown in FIG. 3.

The resonant-tunneling bipolar transistor thus formed has an energy band diagram in thermal equilibrium as shown in FIG. 4A, and the bottom edge of the conduction band and the uppermost edge of the valence band are indicated by Ec and Ev, respectively. As will be seen from FIG. 4A, a quantum-well 11 is created in the quantum-well layer 5, and an energy level of resonant state Ee is formed in the quantum-well 11. Since the gallium arsenide is larger in electron affinity but smaller in the sum of electron affinity and energy bandgap than the aluminum gallium arsenide, an inversion layer 12 takes place at the interface between the first potential barrier layer 4 and the inversion forming layer 2 upon application of an appropriate difference voltage between the emitter and base electrodes 10 and 9 larger than the value equivalent to the energy bandgap of the n-type gallium arsenide used for formation of the inversion forming layer 2 as shown in FIG. 4B. The inversion layer 12 serves as a base region. In the inversion layer 12 is produced a two-dimensional hole gas which is in ohmic contact with the base electrode 9 through the p+ type gallium arsenide layer 3. The inversion layer 12 has a thickness of the order of tens angstroms. This inversion layer 12 has an high density and the two-dimensional hole gas is large in mobility, so that the base resistance is drastically reduced.

As described above, the energy level of resonant state is formed in the quantum-well, and the energy level Ee measured from the bottom edge of the conduction band Ec is represented by the following equation $$Ee = (h^2/8\, m^*) \times (1/L^2)$$

where h is the Plank constant, $m^*$ is the effective mass of electron in the quantum-well 11, and L is the thickness of the quantum-well 11. Then, if the thickness L is appropriately selected, the resonant-tunneling phenomenon takes place in the biasing state which creates the energy band representation illustrated in FIG. 4B. When electrons are injected into the inversion layer 12 or the base region, each of the electrons becomes a hot electron due to not only the resonant energy but also an extremely high built-in potential in the collector depletion layer contiguous to the inversion layer 12. The hot electrons thus created travel over the inversion layer 12 at an extremely high speed in a ballistic manner, thereby decreasing the base transit time period Tb. All of the hot electrons passing therethough are allowed to enter into the collector region because no potential barrier is produced between the inversion layer 12 and the collector region. This results in improvement in current gain or current driving capability. Moreover, each of the hot electrons passes over the collector region in an extremely short time period, and, for this reason, the collector transit time period Tc is also reduced. The accumulation time period of emitter Te is extremely short because of the resonant-tunneling phenomenon. As a result, the resonant-tunneling bipolar transistor embodying the present invention is advantageous over the prior-art resonant-tunneling hot-electron transistor in switching speed. Moreover, the base-collector junction is of the p-n junction reversely biased, so that only a negligible amount of leakage current takes place and, accordingly, the resonant-tunneling bipolar transistor is operable in room temperatures.

Figure 5A:
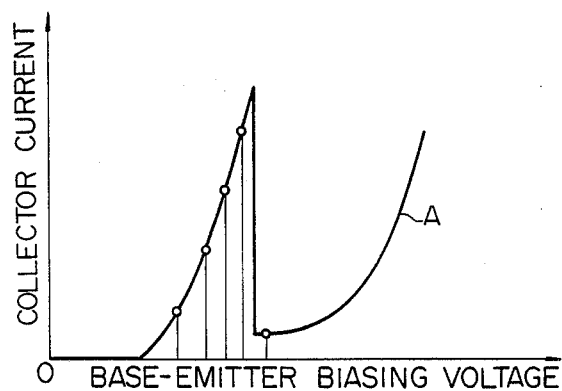
FIG. 5A is a graph showing the relationship between the base-emitter biasing voltage and the collector current observed in the resonant-tunneling bipolar transistor shown in FIG. 3.
Figure 5B:
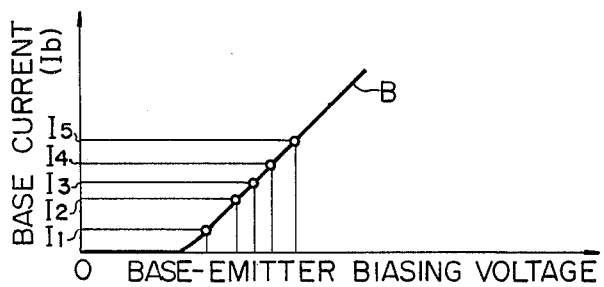
FIG. 5B is a graph showing the relationship between the base-emitter biasing voltage and the base current observed in the resonant-tunneling transistor shown in FIG. 3.
Figure 5C:
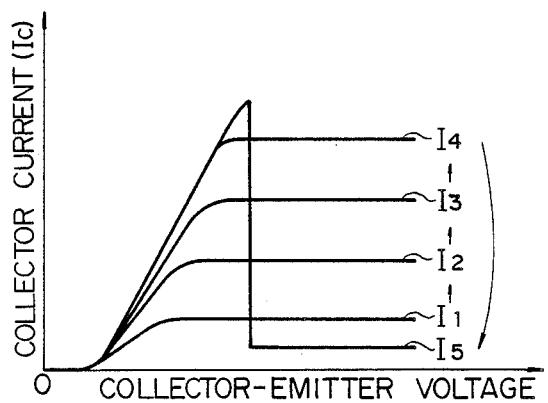
FIG. 5C is a graph showing the relationship between the collector-emitter difference voltage and the collector current observed in the resonant-tunneling bipolar transistor shown in FIG. 3.

In operation, when the base-emitter biasing voltage is increased, the energy level of resonant state Ee is matched with the energy level of electrons in the emitter layer 7, then the resonant-tunneling phenomenon takes place. However, no resonant-tunneling phenomenon takes place out of the conditions, so that the amount of collector current is plotted as curve A in FIG. 5A which represents a negative transconductance. Most of the electrons injected into the inversion layer 12 reach the collector region and, accordingly, absorbed into the collector region, and the two-dimensional hole gas mainly participates the base current. However, the holes are different in resonant-tunneling conditions from the electrons, so that no negative conductance is observed in the base current in terms of the base-emitter biasing voltage as shown by plots B of FIG. 5B. This results in a negative current gain, which is represented by ($\partial Ic/\partial Ib$), as shown in FIG. 5C.

Figure 6:
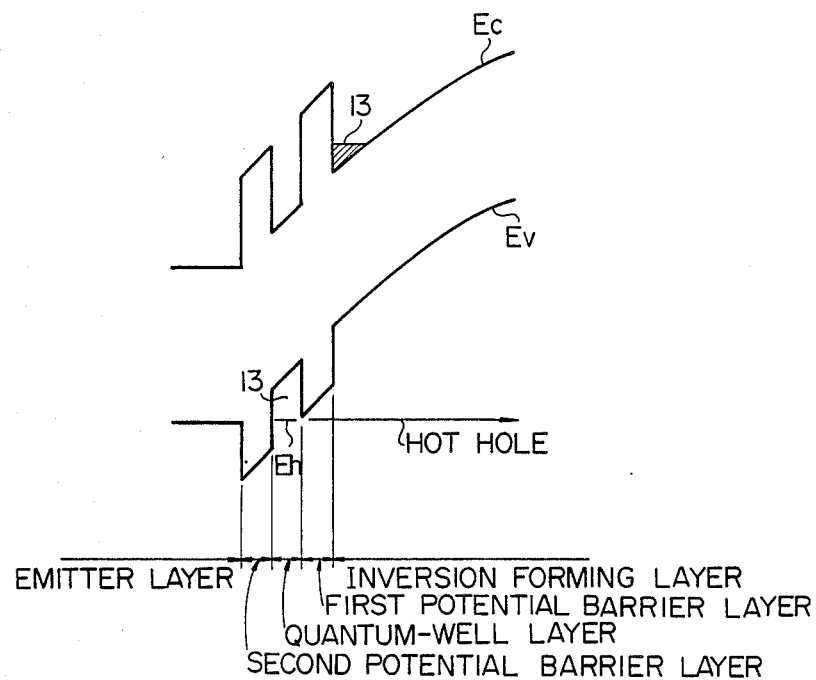
FIG. 6 is a diagram showing the energy band structure in a biasing state created in a modification of the resonant-tunneling bipolar transistor shown in FIG. 3.

The resonant-tunneling phenomenon of electrons is produced in the resonant-tunneling bipolar transistor illustrated in FIG. 3. However, another resonant-tunneling bipolar transistor is implemented by using a resonant-tunneling phenomenon of holes. In this implementation, the emitter layer 7, the inversion forming layer 2, and the p+ type gallium arsenide region 3 are replaced with a p-type aluminum gallium arsenide layer represented by the molecular formula of $Al_yGa_{1-y}As$, a p-type gallium arsenide layer and an n-type gallium arsenide, respectively, and an energy band representation in thermal equilibrium is similar to that shown in FIG. 4A. However, an energy band diagram shown in FIG. 6 takes place upon application of an appropriate biasing voltage between the base electrode and the emitter electrode. An energy level of resonant state Eh is formed for holes in a quantum-well 13, and a two-dimensional electron gas is produced at an interface between the first potential barrier layer and the inversion forming layer and serves as a base region.

In operation, when an appropriate base-emitter biasing voltage is applied between the base electrode and the emitter electrode, the resonant-tunneling phenomenon takes place for producing hot holes which are traveling over the base region at an extremely high speed.

Second Embodiment

Figure 7:
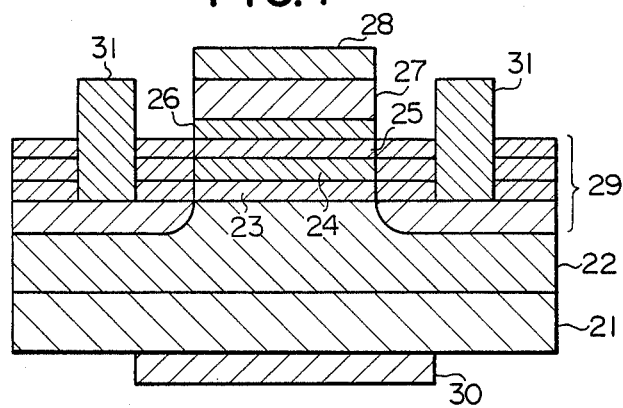
FIG. 7 is a cross sectional view showing the structure of another resonant-tunneling bipolar transistor embodying the present invention.

Turning to FIG. 7 of the drawings, there is shown a still another resonant-tunneling bipolar transistor embodying the present invention. The resonant-tunneling bipolar transistor shown in FIG. 7 is fabricated on a substrate 21 of a heavily doped n-type gallium arsenide, and the substrate 21 serves as a part of collector region in this instance. On the substrate 21 are grown an inversion forming layer 22 of an n-type gallium arsenide doped with n-type impurity atoms of about $1 \times 10^{16}$ atoms/cm$^3$ and having a thickness of about 1.5 micron, a first potential barrier layer 23 of an undoped aluminum arsenide AlAs having a thickness of about 30 angstroms, a quantum-well layer 24 of an undoped gallium arsenide having a thickness of about 50 angstroms, a second potential barrier layer 25 of the undoped aluminum arsenide AlAs having a thickness of about 30 angstroms, an emitter layer 26 of an n-type aluminum gallium arsenide $Al_{0.3}Ga_{0.7}As$ doped with n-type impurity atoms of about $5 \times 10^{17}$ atoms/cm$^3$ and having a thickness of about 700 angstroms, and an emitter contact layer of an n+ type gallium arsenide doped with n-type impurity atoms $5 \times 10^{18}$ atoms/cm$^3$ and having a thickness of about 0.4 micron by using a molecular beam epitaxy process.

Subsequently, an emitter electrode 28 is patterned to form an ohmic contact with the emitter contact layer 27 by using an usual technique. Using the emitter electrode 28 as a mask, the emitter contact layer 27 and the emitter layer are partially etched away to expose the second potential barrier layer 25. Then, p-type impurity atoms are implanted into the first and second potential barrier layers 23 and 25, the quantum-well layer 24 and the inversion forming layer 22 to form a heavily doped p-type region 29 by using the emitter electrode 28 as a mask, and the heavily doped p-type region 29 serves as a conducting portion. Finally, a collector electrode 30 and a base electrode 31 are respectively formed in usual manner.

Figure 8:
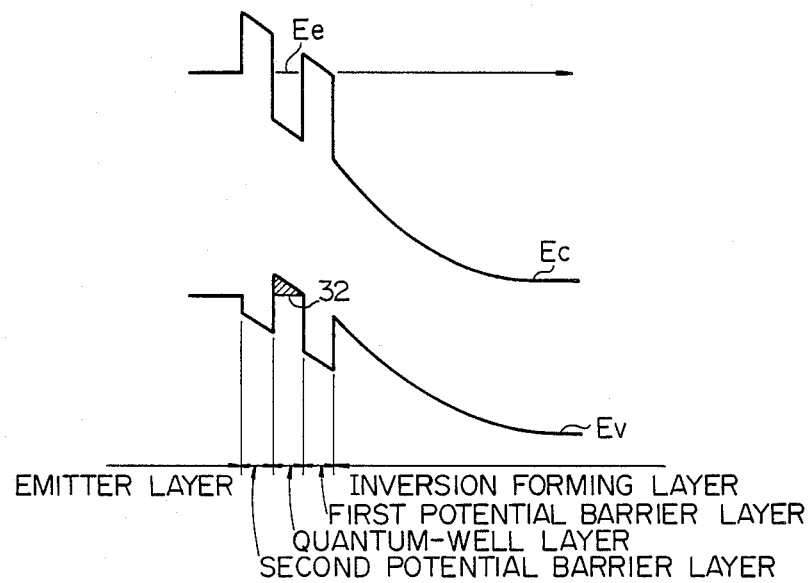
FIG. 8 is a diagram showing the energy band representation in a biasing state created in the resonant-tunneling bipolar transistor illustrated in FIG. 7.

In operation, a two-dimensional hole gas layer takes place at an interface between the inversion forming layer 22 and the first potential barrier layer 23 upon application of an appropriate biasing voltage between the base and emitter electrodes 28 and 31 as similar to the resonant-tunneling bipolar transistor illustrated in FIG. 3. However, since the base electrode 31 is in contact with the first and second potential barrier layers 23 and 25 and the quantum-well layer 24 through the heavily doped p-type region 29, another inversion layer 32 of two-dimensional hole gas takes place in the quantum-well layer 24 as illustrated in FIG. 8. Then, the sheet carrier density is increased by the two-dimensional hole gas, and, for this reason, the resistance is further decreased, thereby being capable of improvement in switching speed.

Third Embodiment

Figure 9:
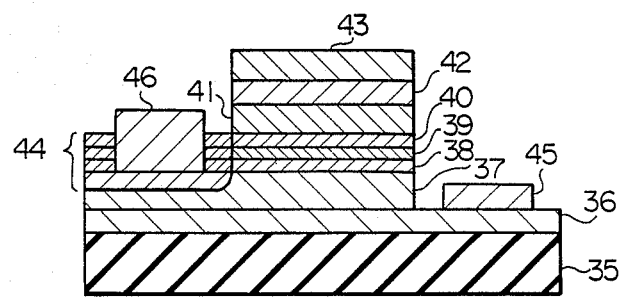
FIG. 9 is a cross sectional view showing the structure of still another resonant-tunneling bipolar transistor embodying the present invention.

Turning to FIG. 9 of the drawings, there is shown the structure of still another resonant-tunneling bipolar transistor embodying the present invention. The resonant-tunneling bipolar transistor shown in FIG. 9 is fabricated on a semi-insulating gallium arsenide substrate 35. On the semi-insulating gallium arsenide substrate 35 are grown a collector layer of a heavily doped p-type gallium arsenide doped with p-type impurity atoms of about $1 \times 10^{19}$ atoms cm$^3$ and having a thickness of about 0.5 micron, an inversion forming layer of a p-type gallium arsenide doped with p-type impurity atoms of about $1 \times 10^{18}$ atoms/cm$^3$ and having a thickness of about 0.1 micron, a first potential barrier layer 38 of an undoped aluminum arsenide having a thickness of about 50 angstroms, a quantum-well layer 39 of an undoped gallium arsenide and having a thickness of about 30 angstroms, a second potential barrier layer 40 formed of the undoped aluminum arsenide and having a thickness of about 50 angstroms, an emitter layer 41 of a p-type aluminum gallium arsenide $Al_{0.2}Ga_{0.8}As$ doped with p-type impurity atoms of about $3 \times 10^{18}$ atoms/cm$^3$ and having a thickness of about 0.1 micron, and an emitter contact layer 42 of a heavily doped gallium arsenide doped with p-type impurity atoms of about $1 \times 10^{19}$ atoms/cm$^3$ and having a thickness of about 0.3 micron by using a molecular beam epitaxy process.

Subsequently, an emitter electrode 43 is formed on the emitter contact layer 42 contacting in an ohmic manner by using an appropriate lithographic process. After formation of the emitter electrode 43, emitter contact layer 42 and the emitter layer 41 are partially removed to expose the second potential barrier layer 40 by using an appropriate etching process, and, then, n-type impurity atoms are implanted into the first and second potential barrier layers 38 and 40, the quantum-well layer 39 and the inversion forming layer 37 to form a heavily doped n-type region 44 by using the emitter electrode 43 as a mask. Then, the inversion layer 37 is further removed to expose the collector layer 36, and a collector electrode 45 and a base electrode 46 are formed in an usual manner.

Fourth Embodiment

Figure 10:
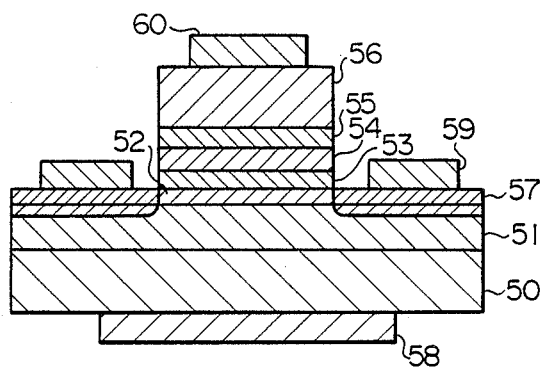
FIG. 10 is a cross sectional view showing the structure of still another resonant-tunneling bipolar transistor embodying the present invention.

Turning to FIG. 10 of the drawings, there is shown still another resonant-tunneling bipolar transistor embodying the present invention. The resonant-tunneling bipolar transistor shown in FIG. 10 comprises a collector region provided with a collector layer 50 of a heavily doped gallium arsenide, a hole confinement layer 51 of an n-type gallium arsenide formed on the collector layer 50, a well providing layer 52 of indium gallium arsenide represented by the molecular formula of $In_zGa_{1-z}As$ and formed on the hole confinement layer 51, a first potential barrier layer 53 of an undoped aluminum gallium arsenide represented by the molecular formula of $Al_xGa_{1-x}As$ and formed on the well providing layer 52, a quantum-well layer 54 of an undoped gallium arsenide formed on the first potential barrier layer 53, a second potential barrier layer 55 of the undoped aluminum gallium arsenide $Al_xGa_{1-x}As$ formed on the quantum-well layer 54, an emitter layer 56 of an n-type aluminum gallium arsenide represented by the molecular formula of $Al_yGa_{1-y}As$ and formed on the second potential barrier layer 55, and a heavily doped p-type region 57 partially formed in the well providing layer 52 and partially penetrating into the hole confinement layer 51. In this instance, the hole confinement layer 51 and the well providing layer 52 as a whole constitute an inversion forming region, and the heavily-doped p-type region 57 serves as a conducting portion. The resonant-tunneling bipolar transistor shown in FIG. 10 further comprises a collector electrode 58 provided on the opposite surface of the collector layer 50, a base electrode provided on the heavily-doped p-type region 57 and an emitter electrode 60 provided on the emitter layer 56. In the molecular formulas, the suffix y is equal to or greater than zero but smaller in value than the suffix x which is equal to or less than one. Moreover, the suffix z ranges between zero and one.

Figure 11A:
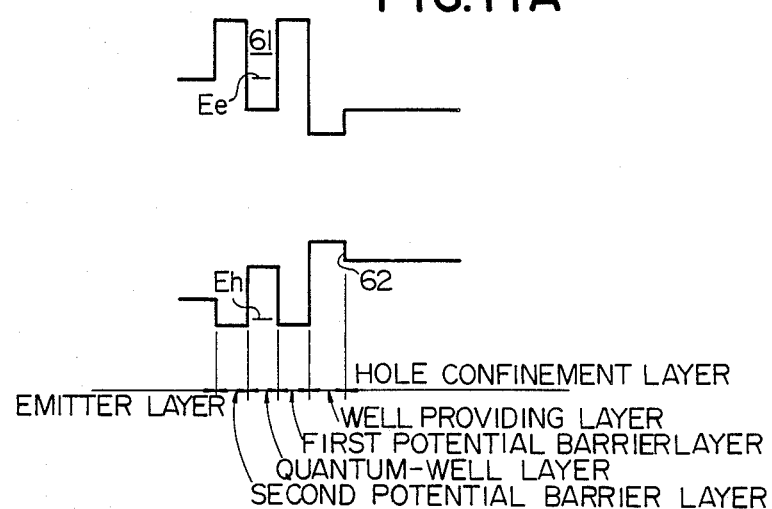
FIG. 11A is a diagram showing an energy band representation in thermal equilibrium created in the resonant-tunneling bipolar transistor shown in FIG. 10.
Figure 11B:
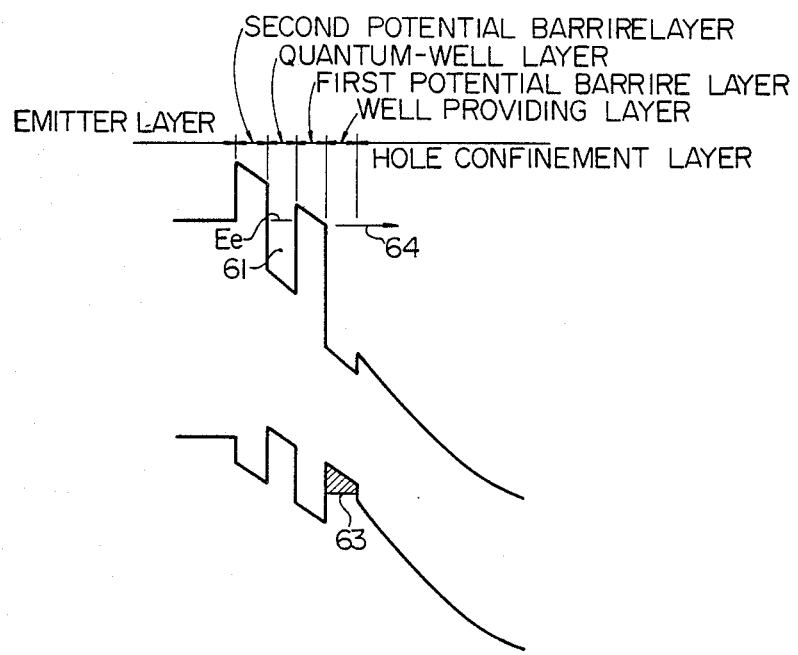
FIG. 11B is a diagram showing an energy band representation in a biasing state created in the resonant-tunneling bipolar transistor shown in FIG. 10.

The undoped gallium arsenide used for the quantum-well layer 54 is larger in electron affinity and smaller in the sum of electron affinity and energy bandgap than the undoped aluminum gallium arsenide used for the first and second potential barrier layers 53 and 55, so that a quantum-well 61 is formed in the quantum-well layer 54 in which an energy level of resonant state Ee takes place as shown in FIG. 11A. The undoped aluminum gallium arsenide used for the first and second potential barrier layers 53 and 55 in turn is smaller in electron affinity and larger in the sum of electron affinity and energy bandgap than the n-type gallium arsenide used for the hole confinement layer 51 which is smaller in electron affinity and larger in the sum of electron affinity and energy bandgap than the indium gallium arsenide used for the well providing layer 52, so that an quantum well for hole 62 takes place in the well providing layer 52. The resonant-tunneling bipolar transistor thus formed produces a two-dimensional hole gas layer 63 in the quantum well for hole 62 upon application of an appropriate biasing voltage between the emitter and base electrodes 60 and 59 as shown in FIG. 11B. The quantum well well for hole 62 confines the two-dimensional hole gas layer 63, so that the two-dimensional hole gas layer is kept in an extremely high hole density. Ec and Ev in FIGS. 4A and 4B designate the bottom edge of the conduction band and the uppermost edge of the valence band, respectively.

A fabrication process starts with a substrate serving as the collector layer 50 for formation of the resonant-tunneling bipolar transistor shown in FIG. 10. On the substrate are grown the hole confinement layer 51 doped with silicon atoms of about $1 \times 10^{16}$ atoms/cm$^3$ and having a thickness of about 1 micron, the well providing layer 52 of, for example, an undoped indium gallium arsenide represented by the molecular formula of In$_{0.3}$Ga$_{0.7}$As and having a thickness of about 80 angstroms, the first potential barrier layer 53 of, for example, an undoped aluminum arsenide having a thickness of about 30 angstroms, the quantum-well layer 54 of, for example, an undoped gallium arsenide having a thickness of about 50 angstroms, the second potential barrier layer 55 of, for example, the undoped aluminum arsenide having a thickness of about 30 angstroms, and the emitter layer 56 of, for example, an aluminum gallium arsenide represented by the molecular formula of Al$_{0.3}$Ga$_{0.7}$As doped with n-type impurity atoms of about $5 \times 10^{17}$ atoms/cm$^3$ by using a molecular beam epitaxy. For improvement of ohmic contact, an emitter contact layer of heavily doped n-type gallium arsenide doped with the n-type impurity atoms of about $5 \times 10^{18}$ atoms cm$^3$ may be further grown on the emitter layer to a thickness of about 0.4 micron. In this instance, the well providing layer is of the undoped indium gallium arsenide represented by the molecular formula of In$_z$Ga$_{1-z}$As where z has a value of 0.3. In general, the larger in value the suffix z is, the smaller in resistance the base layer has, then it is preferable to increase the suffix z in value for reduction in base resistance. However, when the suffix z is increased in value, dislocations tend to take place due to difference in lattice constant between the gallium arsenide and the indium gallium arsenide. However, when the suffix z is selected to be of the order of 0.3, the dislocations are restricted and, accordingly, a good lattice is formed.

Subsequently, the emitter electrode 60 is formed on the emitter layer 56, and the emitter layer 56, the second potential barrier layer 55, the quantum-well layer 54 and the first potential barrier layer 53 are partially removed to expose the well providing layer 52 by using the emitter electrode 60 as a mask. Using the emitter electrode 60 as a mask, in the exposed portion of the well providing layer 52 are implanted p-type impurity atoms which are penetrate into the hole confinement layer 50, thereby forming the heavily doped p-type region 57 serving as a conducting portion. An annealing is carried out to activate the implanted atoms. Finally, the collector electrode 58 and the base electrode 59 are formed as usual manner.

Figure 12:
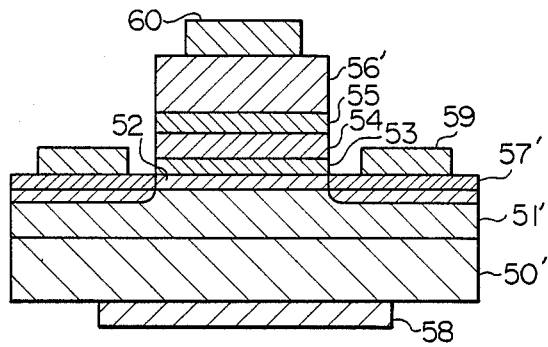
FIG. 12 is a cross sectional view showing the structure of a modification of the resonant-tunneling bipolar transistor shown in FIG. 10.
Figure 13:
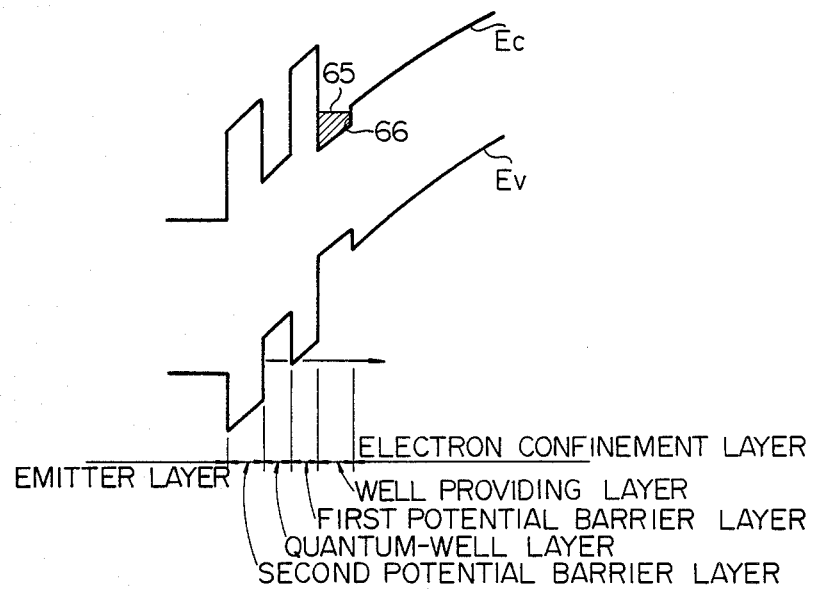
FIG. 13 is a diagram showing an energy band representation in a biasing state created in the resonant-tunneling bipolar transistor illustrated in FIG. 12.

The resonant-tunneling phenomenon of electrons is produced in the resonant-tunneling bipolar transistor illustrated in FIG. 10. However, another resonant-tunneling bipolar transistor is implemented by using a resonant-tunneling phenomenon of holes. The structure thereof is illustrated in FIG. 12, and the collector layer 50, the emitter layer 56, the hole confinement layer 51, and the heavily-doped p-type region 57 are replaced with a heavily doped p-type gallium arsenide layer 50', a p-type aluminum gallium arsenide layer 56' represented by the molecular formula of Al$_y$Ga$_{1-y}$As, an electron confinement layer 51' of a ptype gallium arsenide and an n-type gallium arsenide 57', respectively. However, the other layers are similar to those of the resonant-tunneling transistor illustrated in FIG. 10, and, for this reason, like reference numerals are used for designating the corresponding layers, respectively. An energy band representation in thermal equilibrium is similar to that shown in FIG. 11A, and an energy level of resonant state Eh is formed for holes in a quantum-well 61, and a two-dimensional electron gas 65 is produced in a quantum well for electron 66 in the well providing layer 52 upon application of an appropriate biasing voltage between the emitter and base electrodes 60 and 59 as shown in FIG. 13, and the two-dimensional electron gas 65 serves as a base region. When the indium atoms are increased in the compound semiconductor material of In$_z$Ga$_{1-z}$As, the two-dimensional electron gas layer 65 is increased in density, thereby reducing the base resistance.

In operation, when an appropriate base-emitter biasing voltage is applied between the base electrode and the emitter electrode, the resonant-tunneling phenomenon takes place for producing hot holes which are traveling over the base region in a ballistic manner.

Although particular embodiments of the present invention have been shown and described, it will be obvious to those skilled in the art that various changes and modifications may be made without departing from the spirit and scope of the present invention. For example, an aluminum gallium arsenide/ gallium arsenide compound semiconductor system is employed in the above embodiments, but another compound semiconductor system such as, for example, an indium gallium arsenide/ aluminum indium arsenide compound semiconductor system, a silicon/germanium semiconductor system or a gallium arsenide/germanium semiconductor system is available for implementing a resonant-tunneling bipolar transistor according to the present invention.

What is claimed is:

1. A resonant tunneling bipolar transistor comprising:
   (a) a collector region formed of a first compound semiconductor material of a first conductivity type;
   (b) an inversion forming region provided on one surface portion of said collector region and formed of a second compound semiconductor material of said first conductivity type;
   (c) a first potential barrier region provided on said inversion forming region and formed of a third compound semiconductor material which is larger in the sum of electron affinity and energy band gap or smaller in electron affinity than said second compound semiconductor material;
   (d) a quantum-well region provided on said first potential barrier region and formed of a fourth compound semiconductor material which is larger in electron affinity or smaller in the sum of electron affinity and energy bandgap than said third compound semiconductor material, said quantum-well region providing a quantum-well where an energy level of resonant state takes place;
   (e) a second potential barrier region provided on said quantumwell region and formed of a fifth compound semiconductor material which is smaller in electron affinity or larger in the sum of electron affinity and energy bandgap than said fourth compound semiconductor material;
   (f) an emitter region provided on said second potential barrier region and formed of a sixth compound semiconductor material of said first conductivity type which is larger in electron affinity or smaller in the sum of electron affinity and energy bandgap than said fifth compound semiconductor material, wherein a resonant-tunneling phenomenon takes place at a biasing state applied between said emitter region and said inversion forming region for injecting carriers through said energy level of resonant state into an inversion layer of a second conductivity type opposite to said first conductivity type, said inversion layer being produced at an interface between said first potential barrier region and said inversion forming region under said biasing state.

2. A resonant-tunneling bipolar transistor as set forth in claim 1, in which said resonant-tunneling transistor further has a collector electrode, a base electrode and an emitter electrode which are electrically in contact with said collector region, said inversion forming region and said emitter region, respectively, and in which a conducting portion of said second conductivity type is formed in said inversion forming region so as to provide a conduction path between said base electrode and said inversion layer.

3. A resonant-tunneling bipolar transistor as set forth in claim 2, in which said collector region has a layer formed of a heavily doped n-type gallium arsenide.

4. A resonant-tunneling bipolar transistor as set forth in claim 3, in which said inversion forming region is formed of an n-type gallium arsenide.

5. A resonant-tunneling bipolar transistor as set forth in claim 4, in which said first and second potential barrier regions are formed of an undoped aluminum gallium arsenide represented by the molecular formula of $Al_xGa_{1-x}As$.

6. A resonant-tunneling bipolar transistor as set forth in claim 5, in which said quantum-well region is formed of an undoped gallium arsenide.

7. A resonant-tunneling bipolar transistor as set forth in claim 6, in which said emitter region is formed of an n-type aluminum gallium arsenide represented by the molecular formula of $Al_yGa_{1-y}As$ where the suffix y is smaller in value than the suffix x.

8. A resonant-tunneling bipolar transistor as set forth in claim 2, in which said inversion forming region, said conducting portion and said emitter region are formed of a p-type gallium arsenide, an n-type gallium arsenide and a p-type aluminum gallium arsenide, respectively.

9. A resonant-tunneling bipolar transistor as set forth in claim 2, in which said resonant-tunneling bipolar transistor further comprises an auxiliary conducting region of said second conductivity type electrically connected at one end thereof to said base electrode and at the other end thereof to said first and second potential barrier regions and said quantum-well region.

10. A resonant-tunneling bipolar transistor as set forth in claim 9, in which said collector region has a heavily doped n-type gallium arsenide layer.

11. A resonant-tunneling bipolar transistor as set forth in claim 10, in which said inversion forming region is formed of an n-type gallium arsenide doped with n-type impurity atoms of about $1 \times 10^{16}$ atoms/cm$^3$ and has a thickness of about 1.5 micron.

12. A resonant-tunneling bipolar transistor as set forth in claim 11, in which each of said first and second potential barrier regions is formed of an undoped aluminum arsenide and has a thickness of about 30 angstroms.

13. A resonant-tunneling bipolar transistor as set forth in claim 12, in which said quantum-well region is formed of an undoped gallium arsenide and has a thickness of about 50 angstroms.

14. A resonant-tunneling bipolar transistor as set forth in claim 13, in which said emitter region is formed of an n-type aluminum gallium arsenide represented by the molecular formula of $Al_{0.3}Ga_{0.7}As$ and doped with n-type impurity atoms of about $5 \times 10^{17}$ atoms/cm$^3$ and has a thickness of about 700 angstroms.

15. A resonant-tunneling bipolar transistor as set forth in claim 14, in which said resonant-tunneling bipolar transistor further comprises an emitter contact layer intervening between said emitter region and said emitter electrode, said emitter contact layer being formed of a heavily doped n-type gallium arsenide doped with n type impurity atoms of about $5 \times 10^{18}$ atoms/cm$^3$ and having a thickness of about 0.4 micron.

* * * * *